United States Patent [19]

Jonsson et al.

[11] 4,437,107
[45] Mar. 13, 1984

[54] SELF-IGNITING THYRISTOR WITH A PLURALITY OF DISCRETE, FIELD CONTROLLED ZENER DIODES

[75] Inventors: Per-Erik Jonsson, Bromma; Per Svedberg, Vällingby, both of Sweden

[73] Assignee: ASEA Aktiebolag, Vasteras, Sweden

[21] Appl. No.: 306,255

[22] Filed: Sep. 28, 1981

[30] Foreign Application Priority Data

Oct. 8, 1980 [SE] Sweden .................. 8007036

[51] Int. Cl.$^3$ .................. H01L 29/74; H01L 29/90; H01L 29/02; H01L 29/40
[52] U.S. Cl. .................. 357/38; 357/13; 357/51; 357/52; 357/53; 357/23; 357/30
[58] Field of Search .................. 357/38, 30, 13, 51, 357/52, 53, 23 C; 361/56

[56] References Cited

U.S. PATENT DOCUMENTS

| 3,204,160 | 8/1965 | Sah | 357/38 |
| 3,236,698 | 2/1966 | Shockley | 357/38 |
| 3,427,512 | 2/1969 | Mapother | 357/13 |
| 3,432,731 | 3/1969 | Whittier | 357/53 |

FOREIGN PATENT DOCUMENTS 1166381  3/1964  Fed. Rep. of Germany ........ 357/53

OTHER PUBLICATIONS

IEDM (International Electron Devices Meeting), Technical Digest, 1980, "Functional Integration of Power MOS & Bipolar Devices", T. Tihanyi, pp. 75–78, Dec. 1980.

Primary Examiner—Joseph E. Clawson, Jr.
Assistant Examiner—John LaMont
Attorney, Agent, or Firm—Pollock, Vande Sande & Priddy

[57] ABSTRACT

A self-igniting thyristor has a zener diode integral with the thyristor, which zener diode bridges the central junction of the thyristor and the breakdown voltage of which determines the breakover voltage of the thyristor. The breakdown voltage of the zener diode is determined by the field geometry in that part of the PN junction of the zener diode which is located near the surface of the semiconductor body, where the breakdown is arranged to take place. A conducting screen is arranged over said portion of the PN junction of the zener diode and is separated from the underlying portion of the surface of the semiconductor body by an insulating layer. The thyristor is provided with means for influencing the potential of the screen, which in turn influences the field geometry and thus the breakdown voltage of the zener diode and the breakover voltage of the thyristor.

4 Claims, 10 Drawing Figures

1

SELF-IGNITING THYRISTOR WITH A PLURALITY OF DISCRETE, FIELD CONTROLLED ZENER DIODES

TECHNICAL FIELD

The present invention relates to a thyristor which is arranged for self-ignition and which has a zener diode integral with the thyristor, which zener diode bridges the junction of the thyristor that has the off-state voltage applied across it. The zener diode is constructed so as to determine the breakover voltage of the thyristor. One emitter layer of the thyristor is arranged at one of the main surfaces of the semiconductor body forming the thyristor, and the zener diode is arranged adjacent to the same main surface and adjacent to the emitter layer of the thyristor. The zener diode is constructed in such a way that its breakdown voltage is influenced by the field geometry at a portion of the PN junction of the zener diode positioned adjacent to said main surface.

DISCUSSION OF PRIOR ART

A thryistor of the above-described kind is known from Per Svedberg's U.S. patent application Ser. No. 65,774, filed Aug. 13, 1979, which describes such a thryistor as well as its use as an overvoltage protection device for electronic circuits.

The thyristor is intended to be normally self-igniting and not with the help of a control signal. Thus, the thyristor is intended to automatically change into its conducting state when its off-state voltage exceeds a certain level, herein referred to as the "breakover voltage" of the thyristor.

SPECIFIC EXAMPLE OF PRIOR ART DEVICE

A thryistor of this known kind is shown schematically in cross-section in FIG. 1 of the accompanying drawings. FIG. 2 shows schematically the thyristor of FIG. 1 and the zener diode integral therewith, and FIG. 3 shows the current-voltage characteristics of the thyristor of FIG. 1. The thyristor shown in FIG. 1 has a first emitter layer 1, two base layers 2 and 3 and a second emitter layer 4. The emitter layers 1 and 4 are more strongly doped than the base layers 2 and 3. To reduce the injection efficiency of the anode emitter junction, a highly doped N-conducting layer 3' is provided in the base layer 3 nearest to the emitter layer 4. The impurity concentration of the portion of the layer 3' which is located nearest to the emitter layer 4 is suitably of the same order of magnitude as the impurity concentration of the portion of the layer 4 which is located nearest to the layer 3'. The layer 1 is provided with a cathode contact 6 and the layer 4 with an anode contact 5. To obtain a low contact resistance between the contact 6 and the layer 1, a layer 7 of platinum silicide is arranged nearest the contact 6. The contacts 5 and 6 consist of metal layers, for example gold layers. Possibly, a platinum silicide layer could also be arranged between the contact 5 and the layer 4 in order to reduce the anode contact resistance. The layer 1 is provided with short-circuit holes 8 distributed over its surface, through which the base layer 2 extends up to the cathode contact 6-7. A thin P+-conducting layer 9 is applied at the edge of the base layer 2. The layer 9 suitably extends around the entire edge of the base layer 2 and thus surrounds the emitter layer 1. The layer 9 forms a zener diode together with the layer 3, which zener diode acquires a reverse blocking voltage when a positive anode-cathode voltage is applied across the thyristor. The breakdown voltage (or knee voltage) of the zener diode is determined partly by the impurity concentration in the layer 9 and partly by the radius of curvature ($r_1$ in FIG. 1) at the outer edge of the layer 9. The radius of curvature of the layer 9 influences the field geometry arising at the edge of the layer and thus the magnitude of the highest field strength occurring at a certain applied voltage. Hence, the breakdown voltage may be made to assume a desired value by a suitable choice of the impurity concentration of the layer 9 and the radius of curvature at the edge of the layer. To ensure that breakdown occurs at the zener diode and not in the thyristor proper, the impurity concentration in the layer 9 is preferably greater than that in the layer 2, and further the radius of curvature ($r_1$) at the edge of the layer 9 is smaller than the radius of curvature ($r_2$) at the edge of the layer 2. A layer 10 of platinum silicide gives a low-resistive ohmic connection in the lateral direction from the zener diode over to the base layer 2 of the thyristor itself. The surface of the thyristor is covered by a silicon dioxide layer 11. An annular protective layer 12, which is more heavily N-doped, extends around the edge of the device and prevents surface leakage voltages.

FIG. 2 shows schematically how the thyristor is formed from the layers 1–4 and the contacts 5 and 6. A diode 13, which is conducting at a positive anode voltage, is formed from the layers 4, 3' and 3 and this diode 13 is connected in series with the zener diode 14 formed from the layers 3 and 9. The resistance shown as R1 in FIG. 2 represents the lateral resistance at the layer 10 and at the layer 2 up to the edge of the emitter layer 1. The resistance shown as R2 in FIG. 2 represents the lateral resistance at the layer 2 from the edge of the layer 1 and up to the nearest short-circuit hole 8.

When the voltage across the thryistor is positive at the anode contact 5 and exceeds the knee voltage of the zener diode, current flows through the diodes 13 and 14 and the resistances R1 and R2 to the cathode contact 6 of the thyristor. When the voltage drop across the resistance R2 becomes so great as to reach the on-state voltage drop (ca. 0.5–1 V) at the junction between the layers 1 and 2, the emitter layer 1 starts injecting electrons at its edge located nearest to the zener diode, and thereafter the ignition spreads rapidly over the thyristor surface.

FIG. 3 shows the current-voltage characteristics of the thyristor of FIG. 1, where $U_K$ designates the knee voltage of the zener diode portion, $U_T$ the breakover voltage of the thyristor, $I_T$ the breakover current of the thyristor, and $I_H$ its holding current.

If the holding current of the thyristor is made to be higher than the current that the normal line voltage can drive through the thyristor, the thyristor will stop conducting as soon as the overvoltage has disappeared. The magnitude of the holding current can be set, among other things, by a suitable choice of the number of short-circuit holes 8 per unit surface area.

The steeper is the curve portion A in FIG. 3 (i.e. the lower is the dynamic resistance of the zener diode portion), the more well-defined will be the breakover voltage of the thyristor. For example, when using the thyristor as an overvoltage protection device, it is of great importance that the breakover voltage is as well-defined as possible. A purpose of the invention is therefore to provide a thyristor, where the integrated zener diode portion has as low a dynamic resistance as possible.

LIMITATIONS OF PRIOR ART DESIGN

In certain cases it is desirable for the breakover voltage of the thyristor to be controllable, for example switchable between two values or continuously controllable. If, for example, the thyristor is used as an overvoltage protection device, different levels of protection may be required at different operating states of the equipment it is protecting. By switching over or controlling the breakover voltage in dependence on the operating state of the equipment, the level of protection can be adapted to the requirement at a particular time. It is a further object of the invention to provide a thyristor of the kind described in the introduction, the breakover voltage of which may be varied.

The semiconductor body of a thyristor of low current rating is small, for example a square plate with sides a few millimeters long will often suffice. Encapsulation of the semiconductor body is often achieved by locating the plate between two contact pins inside a capsule in such a way that the end surfaces of the pins each make contact with different ones of the two opposite surfaces of the plate. It is then important that the contact surface of the plate (e.g. the surface of the contact 6 in FIG. 1) is as large as possible. Furthermore, during the encapsulation, a moderate angular adjustment of one of the contact pins may lead to its end surface making contact both with one main contact of the thyristor (e.g. 6 in FIG. 1) and with the edge of the plate, which results in the component being defective. A further object of the invention is therefore to provide a thyristor, in which the semiconductor plate may be given a large contact surface and in which the risk of a contact pin making contact with the edge of the plate during encapsulation can be eliminated.

With a thyristor such as that shown in FIG. 1, there is a risk that during the encapsulation, which must often take place at a relatively high temperature, foreign atoms, for example atoms of iron or copper from the contact pins, will migrate into the semiconductor body through the passivation layer 11 and give an undesirable reduction of the life of the minority charge carriers, and influence the breakover voltage of the thyristor in an unpredictable and undesirable way. One further object of the invention is therefore to provide a thyristor in which the risk of penetration of undesirable impurities is reduced and in which the possibility of the breakover voltage being affected by such impurities is reduced.

STATEMENT OF THE INVENTION

According to the invention a self-ignitable thyristor having a zener diode integral with the thyristor, which zener diode bridges the junction of the thyristor across which the off-state voltage appears and determines the breakover voltage of the thyristor, one emitter layer of the thyristor being located at one main surface of the semiconductor body which forms the thyristor, with the zener diode arranged adjacent to the same main surface and to the emitter layer of the thyristor, the zener diode being so constructed that its breakdown voltage is influenced by the field geometry at a portion of the PN junction of the zener diode located adjacent to said main surface, is characterised in that an electrically conducting screen means is arranged over the said main surface of the thyristor to overlie said portion of the PN junction of the zener diode, an electrically insulating portion is arranged between the screen means and the main surface at least over said portion of the PN junction, and means is provided for influencing the potential of the screen means and thus the field geometry at said portion of the PN junction, and thus for influencing the breakover voltage of the thyristor.

BRIEF DESCRIPTION OF DRAWINGS

The invention will now be described, by way of example, with reference to the accompanying drawings, in which.

DESCRIPTION OF PREFERRED EMBODIMENTS

Figure 4A:
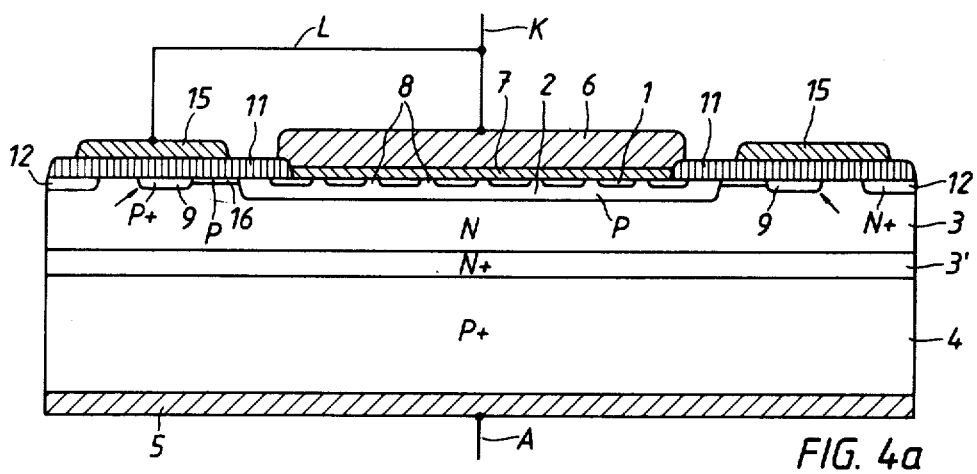
FIGS. 4a and 4b are, respectively, schematic sectional and partial plan views of a first embodiment of thyristor according to the invention.
Figure 4B:
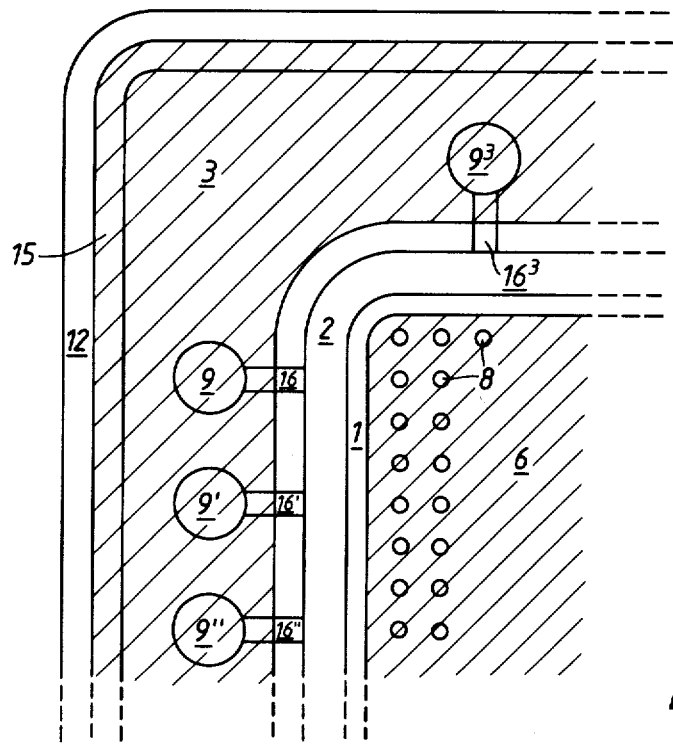

FIG. 4a shows a section through a first embodiment of thyristor according to the invention and FIG. 4b a partial plan thereof seen from above. It has substantially the same construction as the thyristor shown in FIG. 1 and similar reference numerals have been used where appropriate. The anode connection is shown schematically at A and the cathode connection at K. Outside the edge of the P layer 2, there are arranged a number of P+-conducting regions (9). The junction between each such region 9 and the adjacent N-conducting layer 3 constitutes a zener junction. Each such region 9 is connected to the P-layer 2 via a narrow P-doped region 16. On top of the insulating layer 11 and on top of the portion of the zener junction where breakdown is initiated, there is located a screen 15 consisting of a metallic layer.

Figure 3:
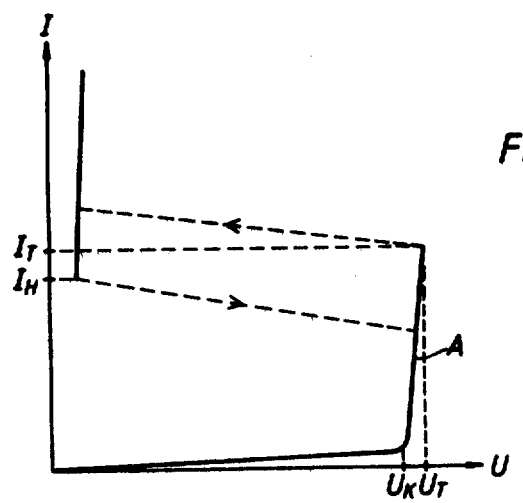

In FIG. 4b the edges of the layers 12, 15, 3, 2, 1 and 6 are marked, as are the short-circuit holes 8. In FIG. 4b, four P+-conducting regions 9, 9', 9" and $9^3$ are shown which are respectively connected to the layer 2 via the P-doped regions 16, 16', 16" and $16^3$. The number of regions 9 and 16 is selected having regard to the total maximum current ($I_T$ in FIG. 3) which the zener junctions have to be capable of carrying, and may, in practice, amount to between one or a few hundred.

The screen 15 may be connected to the cathode 6 of the thyristor (schematically shown in FIG. 4a with a conductor L), to its anode 5, or to some other potential (fixed or variable). The potential of the screen 15 influences the field geometry at the zener diode junction. The screen 15 provides a lateral expansion of the barrier layer, and the portion of each zener junction where maximum field strength occurs, that is where breakdown initiates, are marked by the arrows in FIG. 4a. Typically, maximum field strength and thus breakdown occurs at the portion of the junction which inclines at an angle of about 45° relative to the upper surface of the layer 3, that is, relatively deep under the upper surface of the semiconductor body.

Figure 1:
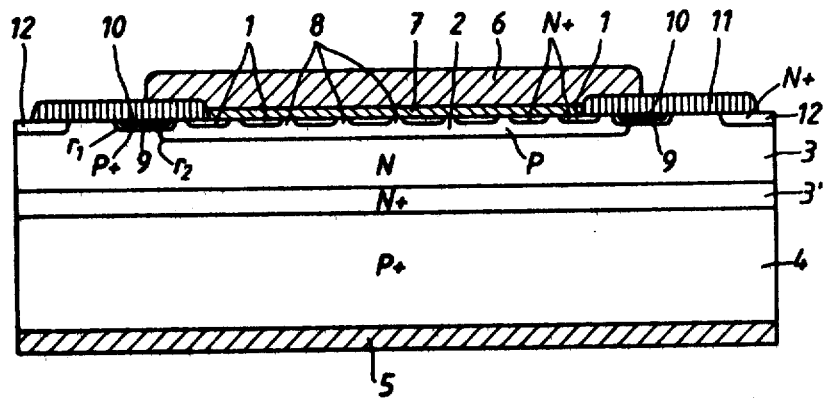
FIGS. 1 to 3 relate to the known thyristor already discussed.
Figure 2:
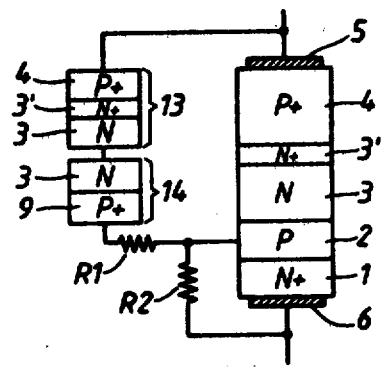

With the previously known thyristor arrangement shown in FIG. 1, practice has shown that breakdown tended to occur at the portion of the zener junction located nearest the surface, probably due to the fact that the treatment steps carried out after the diffusion into the regions 9 change the shape of the junction such that a sharp corner is obtained just below the surface. In this way the breakdown voltage is reduced in an uncontrollable manner, and the breakover voltage of the thyristor becomes lower and exhibits a greater range of variation. Further, the critical part of the junction becomes more exposed to impurities which diffuse into the semiconductor body from its surface and which influence the breakdown voltage.

In a thyristor according to the invention, the influence of the screen 15 causes the breakdown of the zener junction to take place considerably deeper below the surface of the semiconductor body. Possible disturbances in the shape of the junction nearest to the surface will therefore not influence the breakdown voltage. Further, at the critical part of the junction (the part where the breakdown occurs) the content of impurities will be smaller than at the surface. In addition, the screen 15 provides further protection against impurity atoms which may penetrate into the body, for example during the encapsulation. For these reasons, the breakdown voltage of the zener junction, and thus the breakover voltage of the thyristor, will be considerably easier to predict and control and will exhibit a smaller range of variation than with the previously known thyristor. The current in the layer 3 when breakdown occurs will flow deeper in the body where surface recombinations and the content of life-reducing impurities are smaller. This current, which consists of charge carriers injected from the layer 4, contributes to reduce the dynamic resistance of the zener diode portion. This resistance has proved to be considerably lower than with the previously known thyristor, and the portion A of the curve in FIG. 3 therefore becomes steeper, which is an important advantage with a thyristor according to the invention.

It has been shown that in a thyristor according to the invention, the dynamic resistance of the zener diode portion may become negative within part of the current-voltage characteristic, and this is most probably due to the injection efficiency being current-dependent. This phenomenon could lead to instability and oscillation phenomena and difficultly-defined current-voltage characteristics of the thyristor. It is to avoid this phenomenon that in the preferred embodiment of the invention shown in FIGS. 4a and 4b, the regions 9 are separated from the layer 2 and are connected thereto only via the narrow regions 16. The latter regions function as series resistances to the zener diode portions. By choosing suitable values for the length, width, depth and doping of the regions 16, their resistances can be controlled to such values that said instabilities and oscillation tendencies are eliminated. It has proved possible to improve stability without losing the most important advantage of the invention, namely the low dynamic resistance.

Figure 4C:
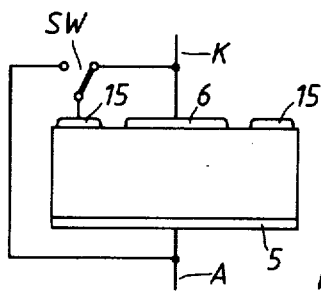
FIGS. 4c and 4d are schematic indications as to how the potential of the screen of the thyristor of FIG. 4a can be adjusted.

In addition to the above-mentioned advantages, the screen 15 also provides a possibility of controlling the breakover voltage of the thyristor. As shown in FIG. 4c, a switch SW may be arranged so that the screen 15 can be optionally connected to either of two potentials. In the case shown in FIG. 4c, these potentials are the anode or cathode potential of the thyristor. When the screen 15 is connected to the cathode 6 of the thyristor, a higher value of the breakover voltage is obtained, and when the screen is connected to the anode 5, a lower value is obtained. The switch SW may be a transistor switch which could possibly be integral with the thyristor, or be arranged in the same enclosure as the thyristor.

The potentials to which the screen can be connected can alternatively be obtained with the aid of voltage sources arranged outside the thyristor enclosure, for example with the aid of voltage dividers arranged between the anode connection A and the cathode connection K of the thyristor.

Figure 4D:
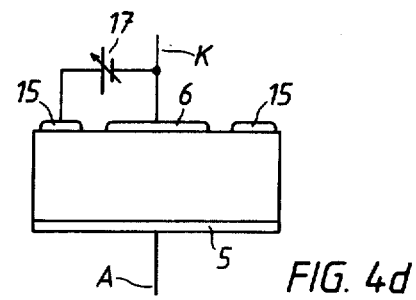

FIG. 4d shows how the screen 15 may be connected to a variable (or alternatively a constant) voltage source 17, which enables the screen to be held at a certain fixed or adjustable potential relative to the cathode connection K. In this way, the breakover voltage of the thyristor can be fixed at a desired value or can be adjusted in a continuously controllable manner.

Figure 5:
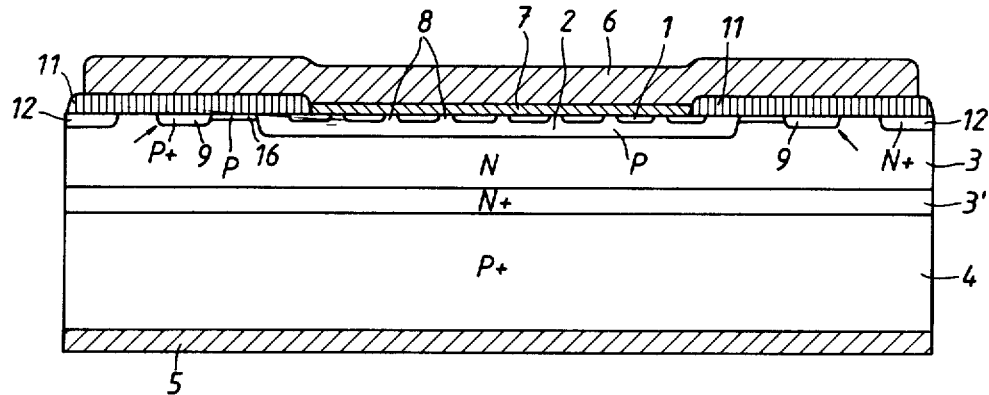
FIGS. 5, 6 and 7 are schematic sectional views of three further embodiments of thyristor in accordance with the invention.

FIG. 5 shows an embodiment of the invention in which the cathode contact 6 has been extended laterally over the zener diode portion to cover this portion. The cathode contact then simultaneously serves as a screen over the zener diode portion and fulfils the same function as the screen 15 described above, provided the screen is connected to cathode potential. With this embodiment, a large cathode contact surface is obtained and furthermore the risk of malfunction, due to a wrong angular adjustment during encapsulation of the contact pin destined to contact the cathode 6, is reduced.

Figure 6:
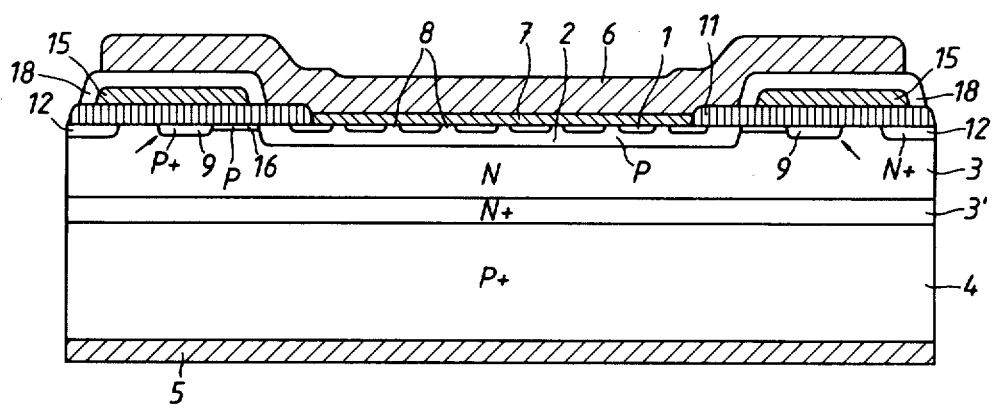

FIG. 6 shows how the above-mentioned advantages can also be obtained with a screen 15 which is not connected to cathode potential. In this embodiment an insulating layer 18, for example of silicon dioxide, is laid over the top of the screen 15. The cathode contact 6 is again extended in the lateral direction but now covers the insulating layer 18.

Figure 7:
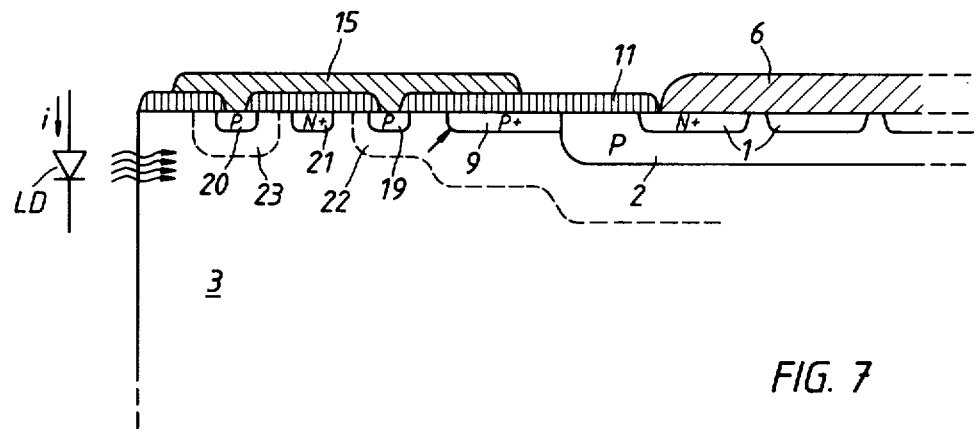

FIG. 7 shows an embodiment of thyristor in which the breakover voltage is optically controllable. Only a part of one edge portion of the thyristor is shown in FIG. 7. In the vicinity of the critical part of the zener junction (indicated by the arrow to the region 9 in the Figure), a P-conducting region 19, an N+-conducting region 21 and a P-conducting region 20 are arranged. The screen 15 makes contact with the regions 19 and 20 through openings in the insulating layer 11. When an off-state voltage exists across the thyristor, a barrier layer 22 appears at the junction between, on the one hand, the layer 3 and, on the other hand, the layers 2 and 9. The region 19 and the screen 15 are then connected via the leakage currents to cathode potential. A barrier layer 23 also appears at the junction between the layer 3 and the region 20. The potential of the screen 15 will be determined by the relationship between the leakage current at the region 20 and the leakage current at the region 19. The device is suitably constructed so that the first-mentioned leakage current is low compared with the last-mentioned leakage current. The screen then normally assumes a potential which is close to the potential of the cathode, and the breakover voltage of the thyristor becomes high. By driving a current i through a light-emitting diode LD, light-emitted from the diode LD impinges on the barrier layer 23 and generates charge carriers in the barrier layer to increase the leakage current and thus increase the potential of the screen 15. The stronger is the illumination, the closer to anode potential will the screen become and the lower will be the breakover voltage of the thyristor.

From FIG. 7 it can be seen that the layer 21 separates the barrier layer 23 from the barrier layer 22.

The light-emitting diode LD may be arranged in the same enclosure as the thyristor, or outside the enclosure.

With the embodiments according to FIGS. 4a and 7, an insulating layer may be applied on top of the screen 15 to eliminate the risk of the screen making contact with the cathode contact pin (e.g. during encapsulation of the thyristor).

In the Figures, the thicknesses of the components are greatly exaggerated in relation to their widths.

What is claimed is:

1. In a self-ignitable thyristor having a zener diode integral with the thyristor, which zener diode bridges the junction of the thyristor across which the off-state voltage appears and determines the breakover voltage of the thyristor, one emitter layer of the thyristor being located at one main surface of the semiconductor body which forms the thyristor, with the zener diode arranged adjacent to the same main surface and to the emitter layer of the thryistor, the zener diode having a breakdown voltage influenced by the field geometry at a portion of the PN junction of the zener diode located adjacent to said main surface, the improvement comprising:

a plurality of zener diodes in the semiconductor body laterally separated from each other and from the base layer adjacent said one emitter layer, each of said zener diodes being connected via resistive means to said base layer of said thyristor, an electrically conducting screen means located over said main surface of the thyristor to overlie said portion of the PN junction of each of the zener diodes for influencing the field geometry at said portion of the PN junction, thereby influencing the breakover voltage of the thyristor, said screen means being electrically connected to the main electrode contacting said one emitter layer so as to have substantially the same potential as said main electrode, and an electrically insulating portion located between the screen means and the main surface at least over said portions of the PN junctions.

2. A thyristor according to claim 1, wherein said main electrode employed to make contact with said one emitter layer extends over said part of the PN junction of each zener diode and provides said screen means.

3. A thyristor according to claim 1, wherein the screen means consists of a separate electrically-conducting layer.

4. A thyristor according to claim 1, in which each of said resistive means is a semiconductor region adjacent said one main surface, extending between said base layer and the region of a zener diode portion which has the same conductivity type as said base layer, and having the same conductivity type as, and a higher resistivity than, said zener diode region.

* * * * *